United States Patent
Goel et al.

(10) Patent No.: US 10,003,325 B2
(45) Date of Patent: Jun. 19, 2018

(54) SYSTEM AND METHOD FOR PROVIDING AN AREA EFFICIENT AND DESIGN RULE CHECK (DRC) FRIENDLY POWER SEQUENCER FOR DIGITAL CIRCUITS

(71) Applicant: Samsung Electronics Co., Ltd., Suwon-si, Gyeonggi-do (KR)

(72) Inventors: Sumeer Goel, Austin, TX (US); Kenneth Hicks, Austin, TX (US); Jan-Michael Huber, Austin, TX (US); Rajesh Kapaluru, Austin, TX (US); Prashant Kenkare, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

(21) Appl. No.: 15/281,064

(22) Filed: Sep. 29, 2016

(65) Prior Publication Data

US 2018/0034448 A1 Feb. 1, 2018

Related U.S. Application Data

(60) Provisional application No. 62/371,702, filed on Aug. 5, 2016, provisional application No. 62/369,746, filed on Aug. 1, 2016.

(51) Int. Cl.
*H03K 3/00* (2006.01)
*H03K 3/012* (2006.01)
*H03K 17/687* (2006.01)
*G05F 3/20* (2006.01)

(52) U.S. Cl.
CPC ............. *H03K 3/012* (2013.01); *G05F 3/205* (2013.01); *H03K 17/6872* (2013.01)

(58) Field of Classification Search
CPC ..... H03K 3/012; H03K 17/6872; G05F 3/205
See application file for complete search history.

(56) References Cited

U.S. PATENT DOCUMENTS

| | | | |
|---|---|---|---|
| 5,942,932 A | 8/1999 | Shen | |
| 6,512,394 B1 * | 1/2003 | Parris | G05F 3/24 326/33 |
| 6,556,071 B2 * | 4/2003 | Notani | H02M 3/07 326/81 |
| 7,394,290 B2 * | 7/2008 | Seo | H03K 19/0016 326/27 |
| 9,112,495 B1 | 8/2015 | Clark et al. | |
| 2016/0026207 A1 | 1/2016 | Boling | |

* cited by examiner

*Primary Examiner* — Kenneth B Wells
(74) *Attorney, Agent, or Firm* — Renaissance IP Law Group LLP (57) ABSTRACT

According to one general aspect, an apparatus may include a power header and a logic circuit. The power header may include a gate terminal, a first channel terminal, a second channel terminal, and a bulk terminal coupled with a first voltage power signal. The power header may be configured to perform one of dynamically coupling or decoupling a logic circuit with the first voltage power signal. The logic circuit may include a bulk terminal coupled with a second voltage power signal and a power terminal that is either dynamically coupled or decoupled, as determined by the power header, with the first voltage power signal. A power sequencing signal may be included in the apparatus and may be configured to control the power header such that, when active, the power header couples the logic circuit with the first voltage power signal after the second voltage power signal is high.

20 Claims, 5 Drawing Sheets

SYSTEM AND METHOD FOR PROVIDING AN AREA EFFICIENT AND DESIGN RULE CHECK (DRC) FRIENDLY POWER SEQUENCER FOR DIGITAL CIRCUITS

CROSS-REFERENCE TO RELATED APPLICATION

This application claims priority under 35 U.S.C. § 119 to Provisional Patent Application Ser. No. 62/369,746, entitled "SYSTEM AND METHOD FOR PROVIDING AN AREA EFFICIENT AND DESIGN RULE CHECK (DRC) FRIENDLY POWER SEQUENCER FOR DIGITAL CIRCUITS" filed on Aug. 1, 2016. The subject matter of this earlier filed application is hereby incorporated by reference.

This application claims priority under 35 U.S.C. § 119 to Provisional Patent Application Ser. No. 62/371,702, entitled "SYSTEM AND METHOD FOR PROVIDING AN AREA EFFICIENT AND DESIGN RULE CHECK (DRC) FRIENDLY POWER SEQUENCER FOR DIGITAL CIRCUITS" filed on Aug. 5, 2016. The subject matter of this earlier filed application is hereby incorporated by reference.

TECHNICAL FIELD

This description relates to controlling the power to an electrical circuit, and more specifically controlling the power to an electrical circuit that makes use of at least two power sources.

BACKGROUND

Design Rule Checking or Checks (DRC) is an area of Electronic Design Automation that determines whether the physical layout of a particular chip layout satisfies a series of recommended parameters called Design Rules. Design rule checking is a major step during physical verification signoff on the design.

Design Rules are a series of parameters provided by semiconductor manufacturers that enable the circuit designer to verify the correctness of a mask set. Design rules are generally specific to a particular semiconductor manufacturing process. A design rule set specifies certain geometric and connectivity restrictions to ensure sufficient margins to account for variability in semiconductor manufacturing processes, so as to ensure that most of the parts work correctly.

Often integrated circuits (e.g., memory circuits) will make use of multiple voltage domains. A higher voltage may be used for certain applications (e.g., access to the memory cells) and a lower voltage is used for the logic or control circuits. The bifurcation of voltage domains allows for a reduction in the power consumption and smaller transistors.

Generally, the bulk terminal (a.k.a. the "N-well" or "Body") of a p-channel metal oxide semiconductor (MOS) (PMOS) transistor is connected to the same power supply as the PMOS's source terminal. For circuits with multiple voltage domains, this procedure can cause issues. For example, most DRC requires that the well-to-well spacing of circuits on different domains be rather large (e.g., to avoid electrical voltage discharge). Further electrical problems may occur if the bulk or body and the source terminal of a device are connected to different voltage supplies. For example, junction diodes may become forward biased and large unintended currents may occur.

SUMMARY

According to one general aspect, an apparatus may include a power header and a logic circuit. The power header may include a gate terminal, a first channel terminal, a second channel terminal, and a bulk terminal coupled with a first voltage power signal. The power header may be configured to perform one of dynamically coupling or decoupling a logic circuit with the first voltage power signal. The logic circuit may include a bulk terminal coupled with a second voltage power signal and a power terminal that is either dynamically coupled or decoupled, as determined by the power header, with the first voltage power signal. A power sequencing signal may be included in the apparatus and may be configured to control the power header such that, when active, the power header couples the logic circuit with the first voltage power signal after the second voltage power signal is high.

According to another general aspect, a method may include dynamically either coupling or uncoupling a logic circuit with a first voltage power signal. The coupling or uncoupling is performed by a power header having a bulk terminal coupled with the first voltage power signal. The logic circuit may include a bulk terminal coupled with a second voltage power signal and a power terminal that is coupled or uncoupled, as determined by the power header, with the first voltage power signal. The method may include controlling, via a power sequencing signal, the power header such that, when active, the power header couples the logic circuit with the first voltage power signal after the second voltage power signal is high.

According to another general aspect, a system may include a power network and a logic circuit. The power network may include a first and a second voltage power source and a power regulating circuit. The first voltage power source may be configured to generate a first voltage power signal The second voltage power source may be configured to generate a second voltage power signal. The first voltage power signal and the second voltage power signal may have either equal or different maximum voltage levels. The power regulating circuit may be configured to couple a logic circuit with the first voltage power signal after the second voltage power signal a high threshold voltage level, and decouple the logic circuit from the first voltage power signal before the second voltage power signal is a low threshold voltage level. The logic circuit may be configured to perform a logic operation. The logic circuit may include a bulk terminal coupled with a second voltage power signal and a power terminal that is coupled/uncoupled, as determined by the power regulating circuit, with the first voltage power signal.

The details of one or more implementations are set forth in the accompanying drawings and the description below. Other features will be apparent from the description and drawings, and from the claims.

A system and/or method for controlling the power to an electrical circuit, and more specifically controlling the power to an electrical circuit that makes use of at least two power sources, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
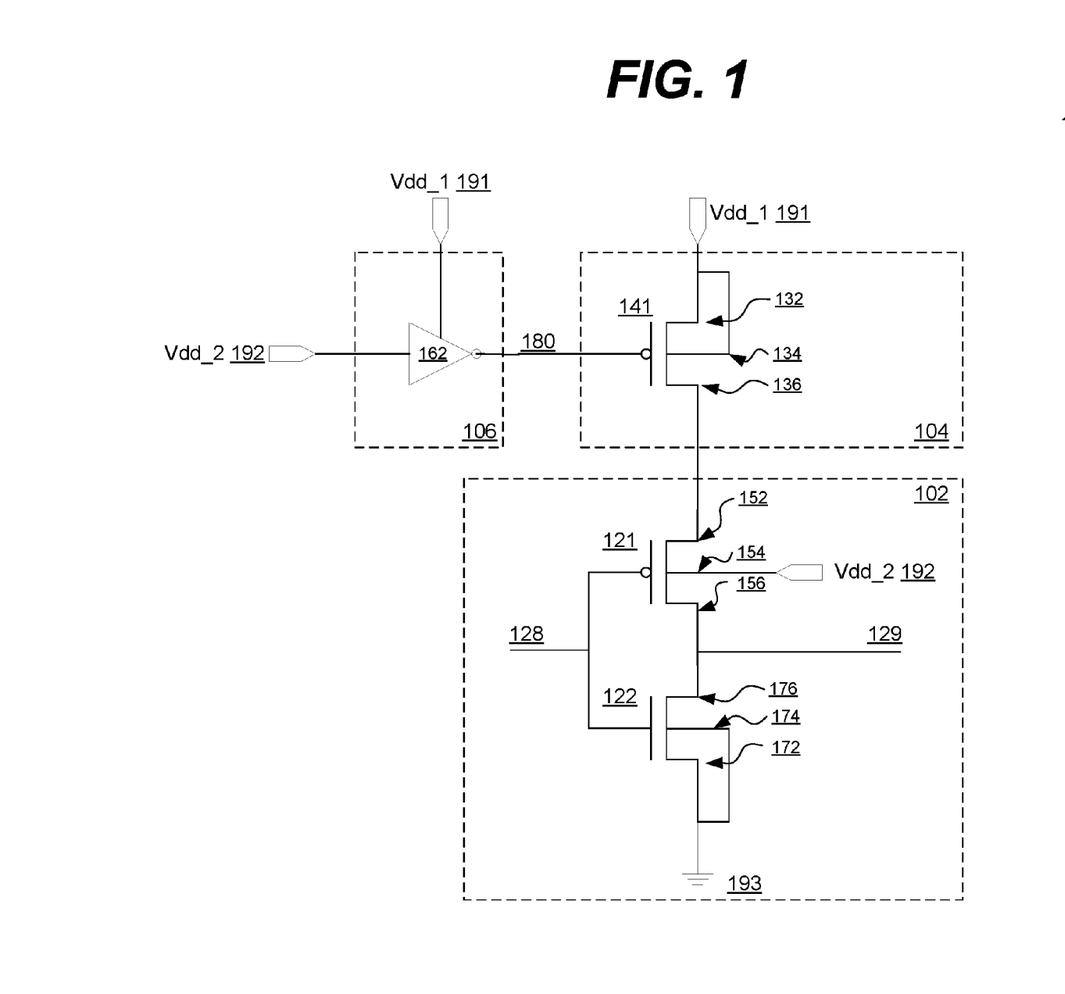
FIG. 1 is a block diagram of an example embodiment of a system in accordance with the disclosed subject matter.

FIG. 1 is a block diagram of an example embodiment of a system 100 in accordance with the disclosed subject matter. In various embodiments, the system 100 may include a power distribution network (illustrated as the voltage power signals 191 & 192, and the circuit 104 & 106) and a logic circuit 102. It is understood that the above is merely one illustrative example to which the disclosed subject matter is not limited.

In various embodiments, the logic circuit 102 may include one or more functional unit blocks (FUBs) of combinatorial logic that are configured to perform operations or execute instructions. In the illustrated embodiment, the logic circuit 102 is represented by the complementary MOS (CMOS) inverter including the PMOS transistor 121 and the n-channel MOS (NMOS) transistor 122. It is understood that the inverter is simply for illustrative purposes and does not limit the disclosed subject matter in any form.

In the illustrated embodiment, the devices (e.g., the inverter) of the logic circuit 102 may be powered by a first voltage power signal (Vdd_1) 191. The first voltage power signal 191 may be generated by a first power supply (not shown). In various embodiments, the first voltage power signal 191 may be supplied to the logic circuit 102 via a power header 104.

In the illustrated embodiment, the NMOS transistor 122 may be conventionally wired. The source or a first channel terminal 172 of the NMOS transistor 122 may be coupled with a ground 193 or lower voltage power signal (Vss). The bulk or body terminal 174 of the NMOS transistor 122 may be coupled with the source terminal 172. The drain or a second channel terminal 176 may be coupled with a drain 156 of the PMOS transistor 121 or the inverter's output terminal 129. The gate terminal (not individually numbered) of the NMOS transistor 122 may be coupled with the inverter 102's input terminal 128.

In the illustrated embodiment, the PMOS transistor 121 may be wired as a multi-voltage domain circuit. The source or a first channel terminal 152 of the PMOS transistor 121 may be coupled with the first voltage power signal 191 (via the power header 104). The drain or a second channel terminal 156 of the PMOS transistor 121 may be coupled with the drain 176 of the NMOS transistor 122 or the inverter's output terminal 129. The gate terminal (not individually numbered) of the PMOS transistor 121 may be coupled with the inverter 102's input terminal 128. The bulk or body terminal 154 of the PMOS transistor 121 may be coupled with a second voltage power signal 192. The second voltage power signal 192 may be generated by a second power supply (not shown).

Those of ordinary skill will recognize that it is not typical to connect the body terminal 154 of the PMOS transistor 121 to a different voltage supply 192 relative to the PMOS source terminal 152 which is coupled to the first voltage supply 191. However, there are circuit applications specific to multiple voltage domains where it is advantageous for the PMOS body terminal 154 to be connected to a different voltage supply relative to the PMOS source terminal 152. One such advantage can be a more area efficient implementation of the system 100. A disadvantage is that the coupling of the source terminal 152 directly with a first voltage signal 191 and the bulk terminal 154 with a second voltage signal 192 can result in the undesirable flow of current from the first voltage signal 191 to the second voltage signal 192 for the case where the voltage signal 191 is powered on prior to the voltage signal 192. This current flow occurs because the source 152 of the PMOS transistor 121 coupled to voltage signal 191 is forward biased with respect to the Nwell body terminal 154 connected to the voltage signal 192. The system 100 illustrates an embodiment of the disclosed subject matter that regulates the coupling or application of the first voltage power signal 191 to the logic circuit 102 in order to ensure that the first voltage signal 191 is decoupled from the P+ source terminal 152 until the second voltage signal 192 ramps up to a "high" value. This "decoupling" action avoids the possibility that P+ source terminal 152 is forward-biased with respect to the Nwell body terminal 154 even for the case where voltage signal 191 is powered on prior to voltage signal 192.

Figure 2:
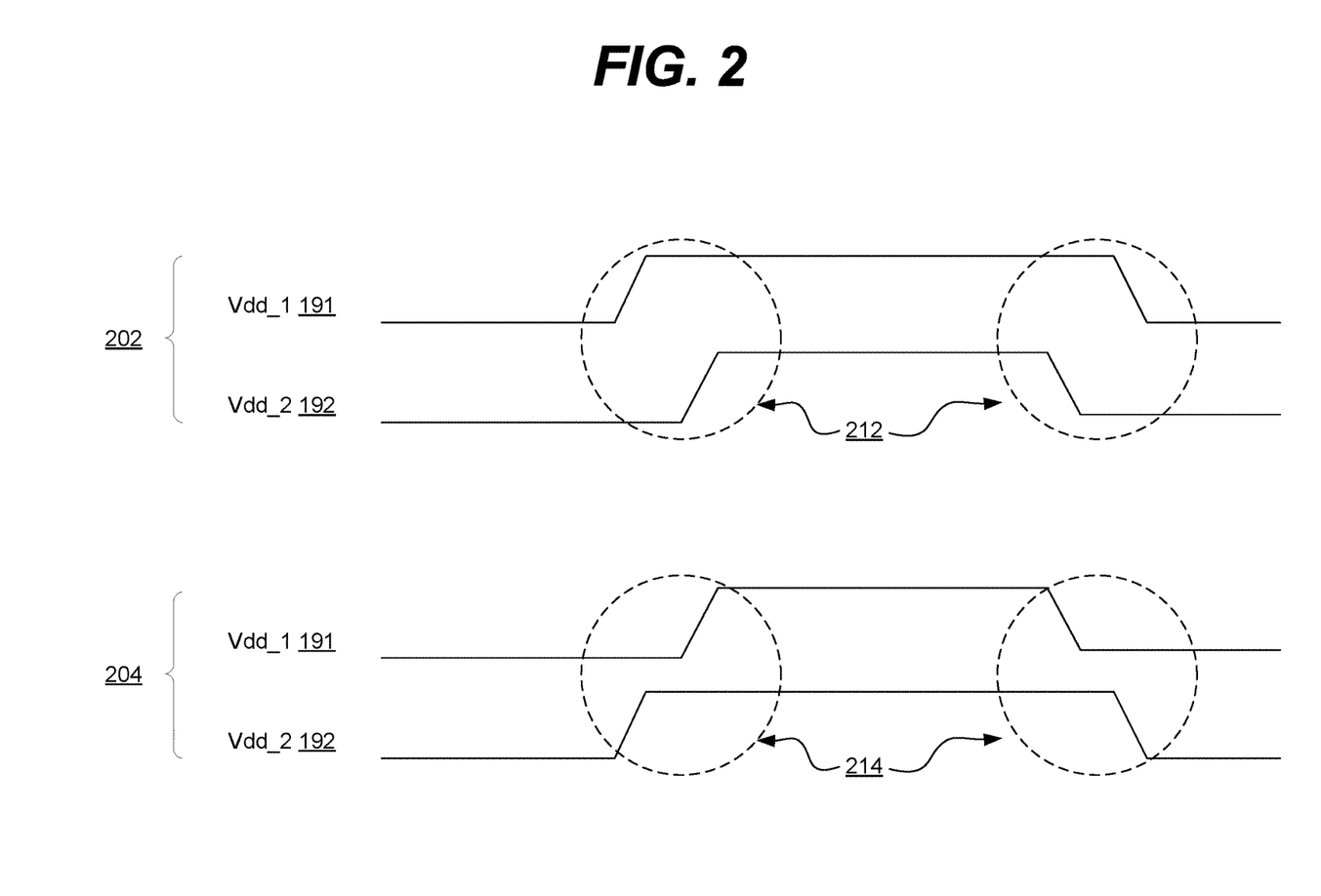
FIG. 2 is a waveform diagram of an example embodiment of a series of waveforms in accordance with the disclosed subject matter.

FIG. 2 is a waveform diagram of an example embodiment of a series of waveforms in accordance with the disclosed subject matter. In the illustrated embodiment, a first set of waveforms 202 shows an undesirable sequencing of the voltages signals 191 and 192. The second set of waveforms 204 shows a more desirable sequencing of the voltages signals 191 and 192.

The waveform set 202 shows two events 212 in which the relationship between Vdd_1 191 and Vdd_2 192 would produce undesirable results for the case where PMOS source terminal 152 is coupled to Vdd_1 191. When the voltage level of Vdd_1 191 is high (or higher than a determined threshold voltage level), and the voltage level of Vdd_2 192 is low (or lower than a determined threshold voltage level), the diode between the channel terminal (e.g., the source 152) and the bulk (e.g., bulk 154) may become forward biased. This is undesirable, as relatively large currents can begin to flow in the circuit along paths which are not designed for large currents. The flow of these large currents for the two events 212 can be avoided by decoupling PMOS source terminal 152 from Vdd_1 191 during the undesirable sequencing of the signals 191 and 192 shown in waveform set 202. In various embodiments, the disclosed matter may control the coupling or decoupling of PMOS source terminal 152 from the voltage signal 191 in order to avoid undesirable results for the Vdd_1 191 and Vdd_2 192 power sequencing shown in waveform set 202.

Conversely, waveform set 204 shows two events 214 that have a desirable sequencing of the signals 191 and 192. If the first voltage signal 191 ramps up or becomes high after the second voltage signal 192, the diode between the channel terminal (e.g., the source 152) and the bulk (e.g., bulk 154) may become reverse biased. The reverse biased diode may not conduct, and no large currents may occur. Likewise, when the voltage signals 191 and 192 are substantially equal (i.e., either both low or high) the diode does not conduct large currents.

Returning to FIG. 1, the system 100 may include a power header 104. In various embodiments, the power header 104 may be configured to dynamically either couple or uncouple (couple/uncouple) a logic circuit 102 with the first voltage power signal 191. In some embodiments, the power header 104 may receive a control or a power sequencing signal 180 configured to cause the power header 104 to couple the logic circuit 102 with the first voltage power signal 191 after the second voltage power signal 192 is high, and decouple the logic circuit 102 with the first voltage power signal 191 before the second voltage power signal 192 is low.

In the illustrated embodiment, the power header 104 may include a transistor 141. In various embodiments, the transistor 141 may include a PMOS transistor although it is understood that the above is merely one illustrative example to which the disclosed subject matter is not limited. The transistor 141 may include a drain or channel terminal 136, coupled with the logic circuit 102. The transistor 141 may include a source or channel terminal 132, coupled with the first voltage power signal 191. The transistor 141 may also include a bulk terminal 134, also coupled with the first voltage power signal 191. By coupling the source terminal 132 and the bulk terminal 134 to the same voltage signal (Vdd_1 191) forward biasing of the diode may be prevented.

The transistor 141 may also include a gate terminal (not individually numbered) that is coupled with the power sequencing signal 180. The power sequencing signal 180 may turn the transistor 141 on and off, therefore coupling or decoupling the logic circuit 102 from the first voltage power signal 191. The power sequencing signal 180 may turn the transistor 141 on during the desirable voltage conditions described above, and turn the transistor 141 off during the undesirable voltage conditions described above.

In the illustrated embodiment, the system 100 may also include a power sequencing circuit 106. The power sequencing circuit 106 may output a control signal, which in the illustrated embodiment is the same as the power sequencing signal 180. However, in another embodiment (e.g., the systems of FIGS. 3 and 4) the output of the power sequencing circuit 106 may be only part of or an input that helps generate the power sequencing signal 180.

In the illustrated embodiment, the power sequencing circuit 106 may include an inverter 162. The inverter 162 may be powered by the first voltage power signal 191. It is understood that the above is merely one illustrative example to which the disclosed subject matter is not limited.

In the illustrated embodiment, the power sequencing circuit 106 may receive as input the second voltage power signal 192. In such an embodiment, the inverter 162 may turn on the power header 104 only when both the first voltage power signal 191 and the second voltage power signal 192 are high. In such an embodiment, the first voltage power signal 191 may be decoupled from the logic circuit 102 when the undesirable events 212 of FIG. 2 might occur.

According to one embodiment, the present system and method provide a power sequencing circuit that allows for the connection of different power supplies to a bulk terminal and a source terminal of a device (e.g., a MOSFET). The present system and method provide a power sequencing circuit that uses a plurality of power supply levels as inputs.

Figure 3:
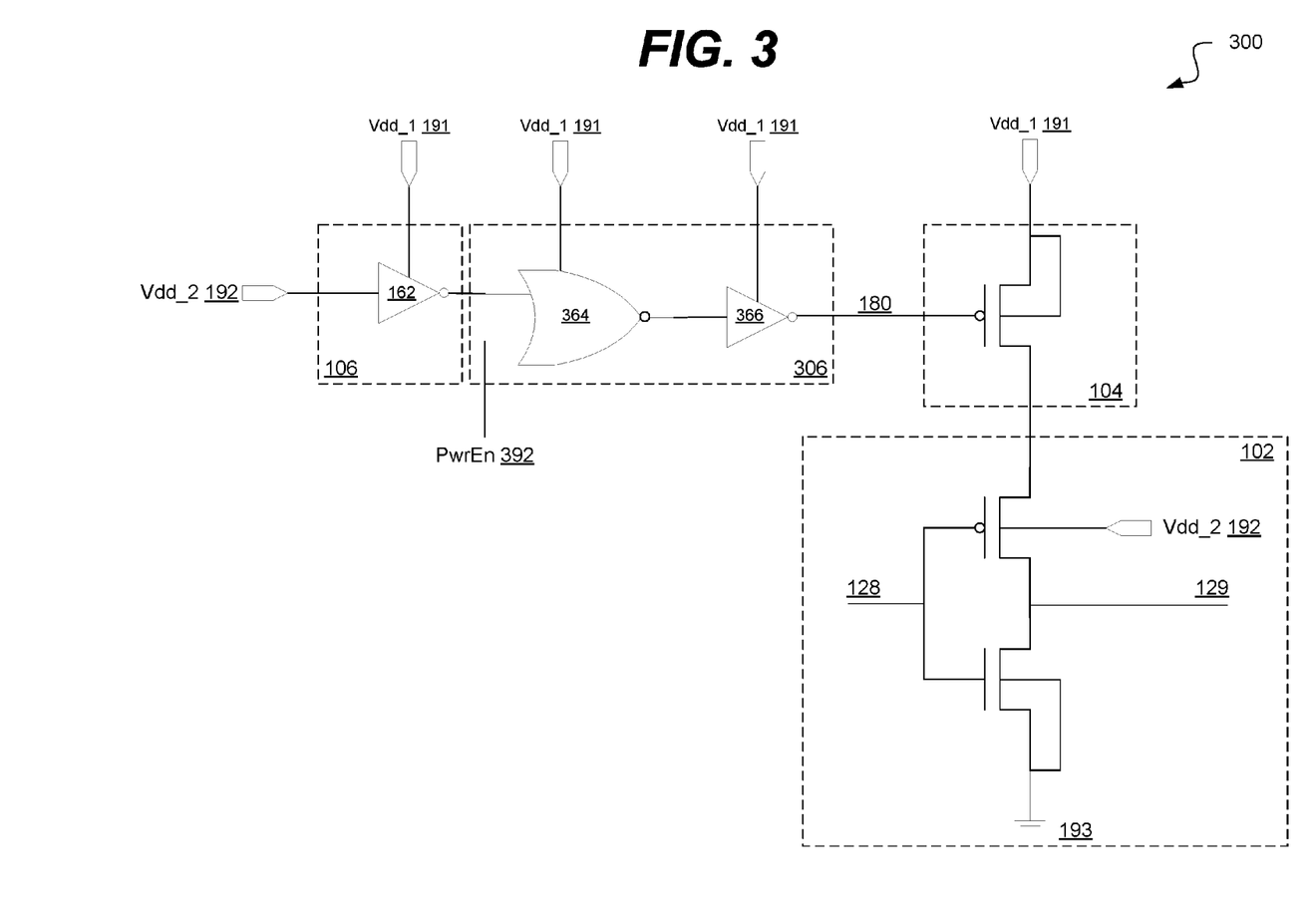
FIG. 3 is a block diagram of an example embodiment of a system in accordance with the disclosed subject matter.

FIG. 3 is a block diagram of an example embodiment of a system 300 in accordance with the disclosed subject matter. In the illustrated embodiment, the power network may include the ability to gate or turn off the power (Vdd_1 191) to the logic circuit 102. Power gating is a technique used in integrated circuit design to reduce power consumption, by shutting off the current to blocks of the circuit (e.g., logic circuit 102) that are not in use. In various embodiments, this power gating may reduce stand-by or leakage power or other power consumption. It is understood that the above are merely a few illustrative examples to which the disclosed subject matter is not limited.

In the illustrated embodiment, the system 300 may include a logic circuit 102, a power header 104, and a power sequencing circuit 106 similarly to those described above. In addition the system 300 may also include a power gating or gating circuit 306. In such an embodiment, the gating circuit 306 may be configured to turn off or cause the power header 104 to decouple the logic circuit 102 from the first voltage power signal 191.

In the illustrated embodiment, the gating circuit 306 may be interposed between the power sequencing circuit 106 and the power header 104. In another embodiment, the order of the circuits that feed into or generate the power sequencing signal 180 may differ. It is understood that the above is merely one illustrative example to which the disclosed subject matter is not limited.

In the illustrated embodiment, the gating circuit 306 may be powered by the first voltage power signal 191. The gating circuit 306 may receive as input the control signal from the power sequencing circuit 106 and a power enable signal 392. In the illustrated embodiment, the power enable signal 392 is shown as a single signal but in various embodiments, a plurality of enable signals may be used depending upon various power events or circuit partitioning that may be employed in the system 300. In various embodiments, the power enable signal 392 may be an active low signal. It is understood that systems herein (e.g., system 100, 300, 400) may be implemented using various logical values and that the power enable signal 392, or any other signal herein, may be active low or active high.

The gating circuit 306 may combine (e.g., a logical OR) the power sequencing circuit 106 and a power enable signal 392 to form the power sequencing signal 180. In the illustrated embodiment, the gating circuit 306 may include a NOR gate 364 and an inverter 366. It is understood that the above are merely a few illustrative examples to which the disclosed subject matter is not limited.

Figure 4:
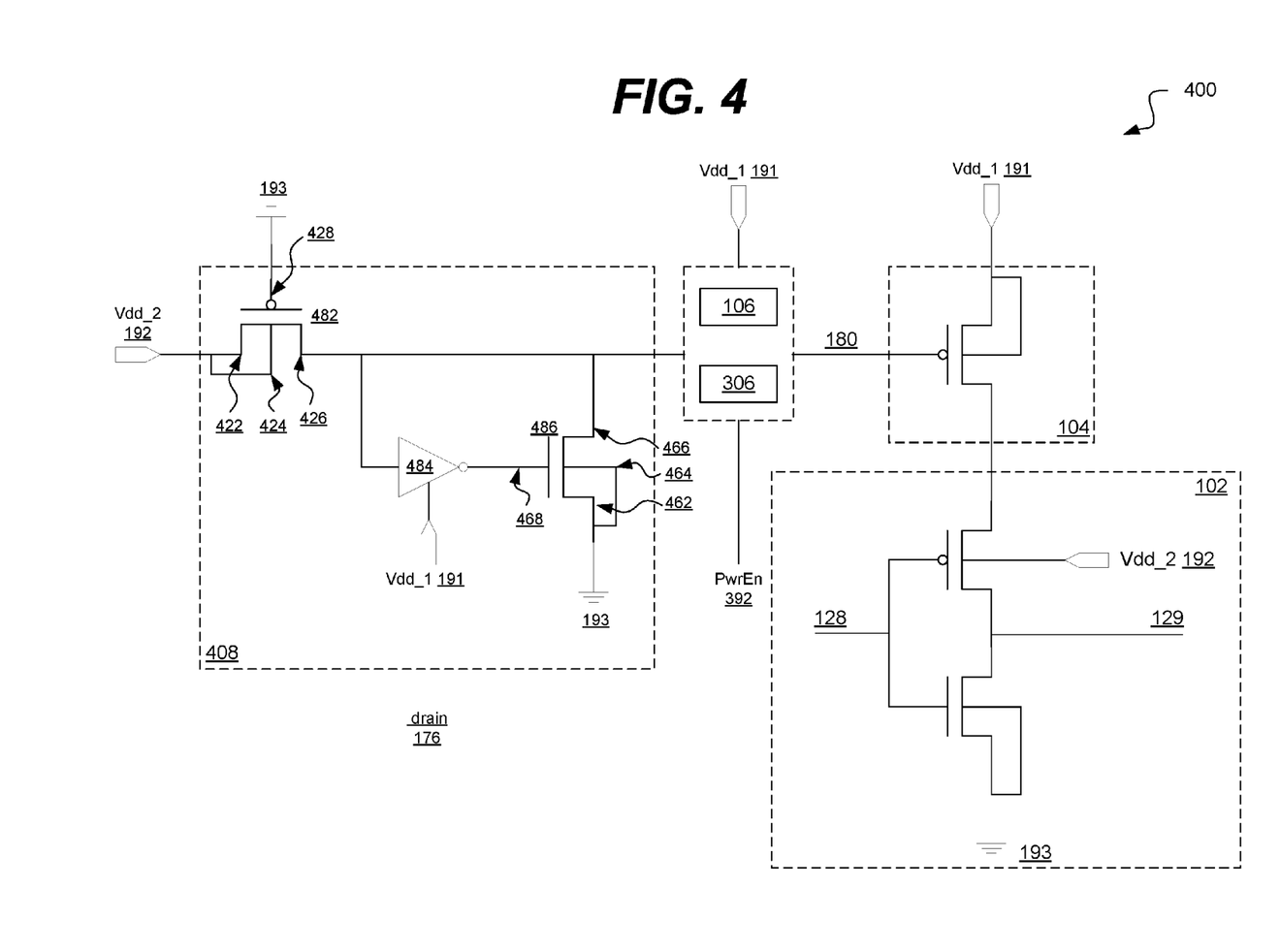
FIG. 4 is a block diagram of an example embodiment of a system in accordance with the disclosed subject matter.

FIG. 4 is a block diagram of an example embodiment of a system 400 in accordance with the disclosed subject matter. In various embodiments, it may be undesirable to attach or couple any power supply (e.g., Vdd_2 192) with any transistor gate terminals. For example, various design rules may disallow it, although it is understood that the above is merely one illustrative example to which the disclosed subject matter is not limited. In such an embodiment, connecting the input or gate terminals of the inverter 162 of the power sequencing circuit 106 (see FIGS. 1 and 3) directly to the second voltage power supply 192 may be undesirable. The system 400 may provide an alternate embodiment to address such a requirement.

In the illustrated embodiment, the system 400 may include a logic circuit 102, a power header 104, and a power sequencing circuit 106 similarly to those described above. In addition the system 400 may also include a power gating or gating circuit 306 (shown in graphical combination with power sequencing circuit 106 due to the space limitations of the drawing). In various embodiments, a variation of system 400 may not include the gating circuit 306. It is understood that the above are merely a few illustrative examples to which the disclosed subject matter is not limited. For example, power sequencing circuit 106 and gating circuit 306 can achieve a similar function by using a different implementation of logic gates than that shown in FIG. 3.

The system 400 may also include a keeper circuit 408. The keeper circuit 408 may be configured to disable the power header 104 until both the first and second voltage power signals 191 & 192 reach a desired voltage level (e.g., high). The keeper circuit 408 may also be configured to provide an input signal to the power sequencing circuit 106 without directly coupling the second voltage power signal 192 with any gate terminals of the power sequencing circuit 106 (or any other circuit).

In various embodiments, the keeper circuit 408 may include a pass gate 482. In the illustrated embodiment, the pass gate 482 may include a PMOS transistor having a source or channel terminal 422, and a bulk terminal 424 coupled with the second voltage power signal 192. The pass gate 482 may include a gate terminal 428 coupled with a ground supply 193. In another embodiment, the gate terminal 428 may be coupled with a third voltage power signal (Vss). It is understood that the above are merely a few illustrative examples to which the disclosed subject matter is not limited. The output of the pass gate 482 may be the drain or channel terminal 426.

In the illustrated embodiment, the keeper circuit 408 may include a pull down transistor 486. The pull down transistor 486 may be configured to, when in an active state, pull the output of the pass gate down to ground 193 or, more generally, low. In various embodiments, the pull down transistor 486 may include an NMOS transistor. The pull down transistor 486 may include a source or channel terminal 462, and a bulk terminal 464 coupled with a ground 193. The pull down transistor 486 may include a gate terminal 468. The pull down transistor 486 may include a drain or channel terminal 466 coupled with the output 426 of the pass gate 482.

In the illustrated embodiment, the keeper circuit 408 may include an inverter 484. The inverter 484 may be powered by the first voltage power signal 191. The inverter 484 may take, as input, the output 426 of the pass gate 482, and output a signal to the gate terminal 468 of the pull down transistor 486.

In the illustrated embodiment, the pass gate 482, as a PMOS transistor, generates what is known as a weak low signal when Vdd_2 192 is low. The inverter 484 inverts that weak low to a strong Vdd_1 191 domain high signal. This high signal may turn on the pull-down transistor 486. As an NMOS transistor, the pull-down transistor 486 may output what is known as a strong low signal at the drain terminal 466. This strong low signal may then be input into the power sequencing circuit 106. The power sequencing circuit 106 may then instruct the power header 104 to decouple the first voltage power signal 191 from the logic circuit 102.

Conversely, if Vdd_2 192 is high the pass gate 482 may pass a strong high signal. The pulldown transistor 486 may be turned off, allowing the pass gate 482 to dominate and set the output signal to a high value. This strong high signal may then be input into the power sequencing circuit 106. The power sequencing circuit 106 may then instruct the power header 104 to couple or decouple the first voltage power signal 191 from the logic circuit 102, depending upon the state of the first voltage power signal 191.

The disclosed subject matter allows area-efficient layout where the bulk or N-well terminal of a PMOS device may be connected to a different power supply from the source terminal of the PMOS device. The disclosed subject matter may prevent forward-biased diode currents regardless of the power ramp-up sequence for different power supplies.

Such a circuit structure mimics supply values in logical operations while maintaining DRC cleanliness. The present power sequencing circuit prevents catastrophic electrical events when the source terminal and the bulk terminal of the device are connected to different power supplies. For example, the present circuit eliminates undesirable diode currents in digital circuits during a power on/off sequence of the chip. The present circuit also eliminates direct connection of NMOS devices to any global power supply thus complying with possible ESD and DRC requirements which might exist in specific process technology nodes.

Figure 5:
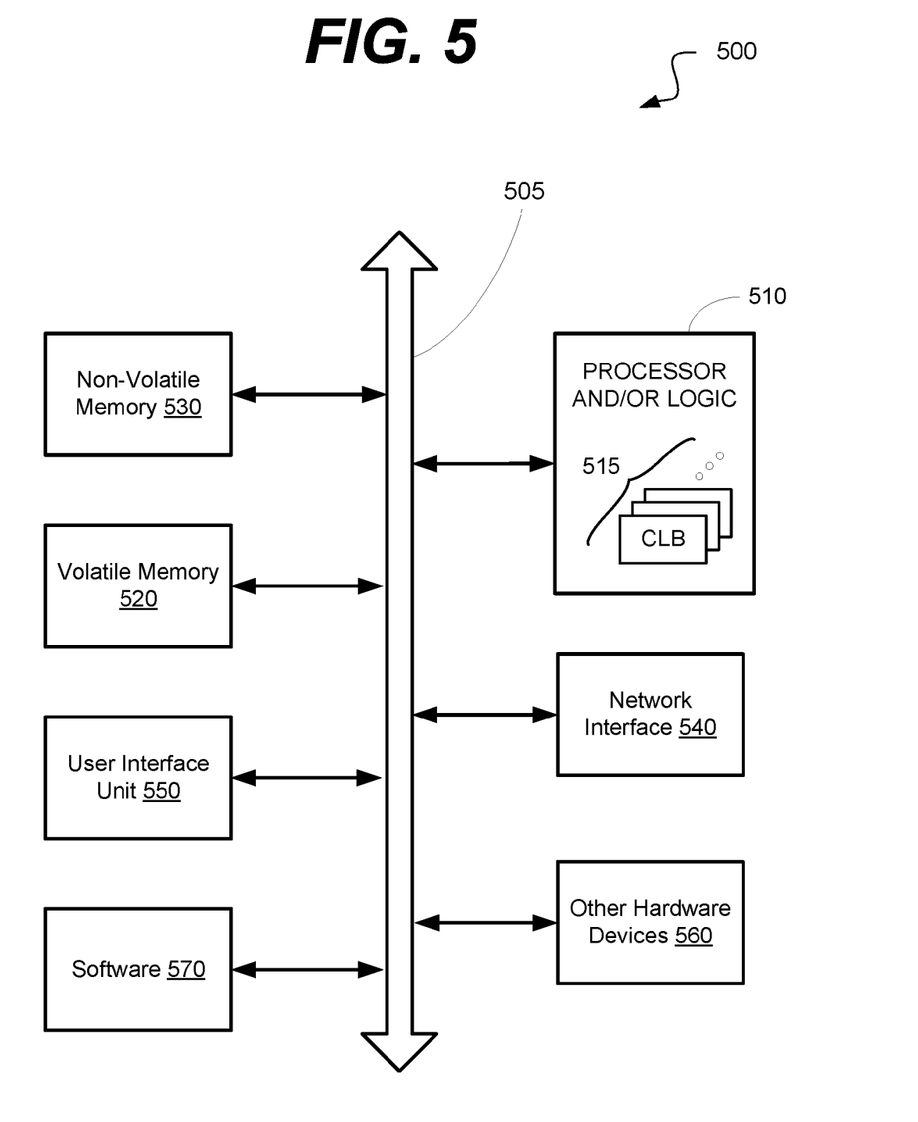
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers, and so on or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR, and so on), stabilizing logic devices (e.g., flip-flops, latches, and so on), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM), and so on). The information processing system 500 according to the disclosed subject matter may further include a non-volatile memory 530 (e.g., a hard drive, an optical memory, a NAND or Flash memory, and so on). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n, and so on. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), and so on. Examples of a wired protocol may include, but are not limited to, IEEE 802.3 (a.k.a. Ethernet), Fibre Channel, Power Line communication (e.g., HomePlug, IEEE 1901, and so on), and so on. It is understood that the above are merely a few illustrative examples to which the disclosed subject matter is not limited.

The information processing system 500 according to the disclosed subject matter may further include a user interface unit 550 (e.g., a display adapter, a haptic interface, a human interface device, and so on). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor, and so on). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540, and so on) of the information processing system 500. In such an embodiment, the information processing system 500 may include one or more native applications, which may be installed locally (e.g., within the non-volatile memory 530, and so on) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey, and so on) or a virtual execution machine (VM) (e.g., the Java Virtual Machine, the Microsoft Common Language Runtime, and so on) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, and so on). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
a power header comprising a gate terminal, a first channel terminal, a second channel terminal, and a bulk terminal coupled with a first voltage power signal, and the power header configured to perform one of dynamically coupling or decoupling a logic circuit with the first voltage power signal;
the logic circuit comprising a bulk terminal coupled with a second voltage power signal and a power terminal that is either dynamically coupled or decoupled, as determined by the power header, with the first voltage power signal; and
a power sequencing circuit configured to receive as input the second voltage power signal, and output a power sequencing signal, wherein the power sequencing signal controls the power header such that, when active, the power header couples the logic circuit with the first voltage power signal after the second voltage power signal is high.

2. The apparatus of claim 1, wherein the power sequencing circuit comprises:
an inverter powered by the first voltage power signal, receiving as input the second voltage power signal, and outputting a control signal; and
wherein the power sequencing signal comprises, at least in part, the control signal.

3. The apparatus of claim 2, wherein the power sequencing circuit comprises:
a gating circuit configured to output the power sequencing signal and configured to gate propagation of the control signal based upon an enable signal, wherein the gating circuit is configured to be powered by the first voltage power signal; and wherein the enable signal is configured to turn off/on the logic circuit.

4. The apparatus of claim 1, further comprising a keeper circuit configured to disable the power header until both the first and second voltage power signals reach a desired voltage level.

5. The apparatus of claim 4, wherein the keeper circuit comprises:
a pass gate having the second voltage power signal as an input;
an inverter having an output of the pass gate as an input and powered by the first voltage power signal; and
a transistor comprising a gate terminal coupled with an output of the inverter and a channel terminal coupled with the output of the pass gate;
wherein the power sequencing signal comprises, at least in part, the output of the pass gate.

6. The apparatus of claim 5, wherein the pass gate is configured to pass a weak low value when the second voltage power signal is low; and
wherein the transistor is configured to pull the output of the pass gate to a strong low value when the first voltage power signal is high.

7. The apparatus of claim 1, wherein the logic circuit comprises a CMOS circuit that comprises:
a directly powered transistor having the bulk terminal and the power terminal; and
an indirectly powered transistor having no direct connection to the first voltage power signal.

8. A method comprising:
dynamically coupling or uncoupling a logic circuit with a first voltage power signal,
wherein the coupling or uncoupling is performed by a power header having a bulk terminal coupled with the first voltage power signal, and
wherein the logic circuit comprises a bulk terminal coupled with a second voltage power signal and a power terminal that is coupled or uncoupled, as determined by the power header, with the first voltage power signal; and
controlling, via a power sequencing signal, the power header such that, when active, the power header couples the logic circuit with the first voltage power signal after the second voltage power signal is high, wherein the power sequencing signal is generated, at least in part, by a power sequencing circuit that receives as input the second voltage power signal and outputs at least a portion of the power sequencing signal.

9. The method of claim 8, wherein controlling the power sequencing circuit comprises:
receiving the second voltage power signal as input by an inverter powered by the first voltage power signal; and
outputting a control signal by the inverter,
wherein the power sequencing signal comprises, at least in part, the control signal.

10. The method of claim 9, wherein controlling the power header comprises:
gating, by a gating circuit, the power sequencing signal based upon an enable signal;
wherein the gating circuit is configured to be powered by the first voltage power signal; and
wherein the enable signal is configured to turn off/on the logic circuit.

11. The method of claim 8, further comprising disabling the power header until both the first and second voltage power signals reach a desired voltage level.

12. The method of claim 11, wherein a keeper circuit comprises:
a pass gate having the second voltage power signal as an input;
an inverter having an output of the pass gate as an input and powered by the first voltage power signal; and
a transistor comprising a gate terminal coupled with an output of the inverter and a channel terminal coupled with the output of the pass gate;
wherein power sequencing signal comprises, at least in part, the output of the pass gate.

13. The method of claim 12, disabling comprises:
passing, by the pass gate, a weak low value when the second voltage power signal is low; and
pulling the output of the pass gate to a strong low value when the first voltage power signal is high.

14. The method of claim 8, wherein the logic circuit comprises a CMOS circuit that comprises:
a directly powered transistor having the bulk terminal and the power terminal; and
an indirectly powered transistor having no direct connection to the first voltage power signal.

15. A system comprising:
a power network comprising:
a first voltage power source configured to generate a first voltage power signal, a second voltage power source configured to generate a second voltage power signal, wherein the first voltage power signal and the second voltage power signal may have either equal or different maximum voltage levels, and
a power regulating circuit configured to couple a logic circuit with the first voltage power signal after the second voltage power signal reaches a high threshold voltage level, and decouple the logic circuit from the first voltage power signal before the second voltage power signal falls below a low threshold voltage level,
wherein the power regulating circuit comprises a power header configured to dynamically couple/uncouple the logic circuit with/from the first voltage power signal, wherein the power header is controlled, at least in part, by a power sequencing circuit that receives as input the second voltage power signal, and outputs a control signal; and
wherein the logic circuit comprises a bulk terminal coupled with the second voltage power signal and a power terminal that is coupled/uncoupled, as determined by the power regulating circuit, with the first voltage power signal.

16. The system of claim 15, wherein the
power header comprises a bulk terminal coupled with a first voltage power signal; and
wherein the power sequencing circuit comprises an inverter that is powered by the first voltage power signal, receives as input the second voltage power signal, and outputs the control signal to control the power header.

17. The system of claim 16, wherein the power regulating circuit comprises:
a gating circuit configured to output a power sequencing signal and configured to gate propagation of the control signal based upon an enable signal, wherein the gating circuit is configured to be powered by the first voltage power signal; and
wherein the enable signal is configured to turn off/on the logic circuit.

18. The system of claim 16, wherein the power regulating circuit comprises a keeper circuit configured to disable the power header until the first voltage power signal reaches a first desired voltage level and the second voltage power signal reaches a second desired voltage level.

19. The system of claim 18, wherein the keeper circuit comprises:
a pass gate having the second voltage power signal as an input;
an inverter having an output of the pass gate as an input and powered by the first voltage power signal; and
a transistor comprising a gate terminal coupled with an output of the inverter and a channel terminal coupled with the output of the pass gate;
wherein the control signal comprises, at least in part, the output of the pass gate.

20. The system of claim 19, wherein the pass gate is configured to pass a weak low value when the second voltage power signal is low; and
wherein the transistor is configured to pull the output of the pass gate to a strong low value when the first voltage power signal is high.

* * * * *